(12) United States Patent
Tsuzuki et al.

(10) Patent No.: US 8,729,600 B2
(45) Date of Patent: May 20, 2014

(54) INSULATED GATE BIPOLAR TRANSISTOR (IGBT) WITH HOLE STOPPER LAYER

(75) Inventors: Yukio Tsuzuki, Nukata-gun (JP); Kenji Kouno, Gifu (JP); Hiromitsu Tanabe, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 161 days.

(21) Appl. No.: 13/534,530

(22) Filed: Jun. 27, 2012

(65) Prior Publication Data

US 2013/0009205 A1  Jan. 10, 2013

(30) Foreign Application Priority Data

Jul. 4, 2011 (JP) ................ 2011-148138
Apr. 18, 2012 (JP) ................ 2012-094769

(51) Int. Cl.
*H01L 29/66* (2006.01)

(52) U.S. Cl.
USPC .................. 257/139; 257/E29.197

(58) Field of Classification Search
USPC ......... 257/133, 135, 137, 138, 139, 152, 288, 257/328–335, 341, 347, 369, 409, 410, 578, 257/583, 632, E29.001, E29.002, E29.005, 257/E29.024, E29.026, E29.027, E29.028, 257/E29.19, 8
See application file for complete search history.

(56) References Cited

U.S. PATENT DOCUMENTS

| 5,751,024 | A | 5/1998 | Takahashi |
| 7,638,839 | B2 * | 12/2009 | Arai et al. .......... 257/331 |
| 2010/0039844 | A1 | 2/2010 | Arai et al. |
| 2011/0193132 | A1 | 8/2011 | Kouno et al. |

FOREIGN PATENT DOCUMENTS

JP  A-2007-266134  10/2007

* cited by examiner

*Primary Examiner* — Selim Ahmed
(74) *Attorney, Agent, or Firm* — Posz Law Group, PLC

(57) ABSTRACT

A semiconductor device has a first conductivity-type semiconductor substrate, second conductivity-type channel regions, and second conductivity-type thinning-out regions. The channel regions and the thinning-out regions are formed adjacent to a substrate surface of the semiconductor substrate. Further, a hole stopper layer is formed in each of the thinning-out regions to divide the thinning-out region into a first part adjacent to the substrate surface and a second part adjacent to a bottom of the thinning-out region. The hole stopper layer has an area density of equal to or less than $4.0 \times 10^{12}$ cm$^{-2}$ to permit a depletion layer to punch through the hole stopper layer, thereby to restrict breakdown properties from being decreased.

7 Claims, 10 Drawing Sheets

INSULATED GATE BIPOLAR TRANSISTOR (IGBT) WITH HOLE STOPPER LAYER

CROSS REFERENCE TO RELATED APPLICATION

This application is based on Japanese Patent Applications No. 2011-148138 filed on Jul. 4, 2011 and No. 2012-94769 filed on Apr. 18, 2012, the disclosure of which is incorporated herein by reference.

TECHNICAL FIELD

The present disclosure relates to a semiconductor device having an insulated gate bipolar transistor (IGBT) element.

BACKGROUND

For example, JP 2007-266134A describes a semiconductor device with an IGBT element used as a switching element for an inverter or the like. The semiconductor device has a semiconductor substrate forming a drift layer, and two types of partial regions at a front surface of the semiconductor substrate.

Each of the first-type partial regions includes a P-type first body region, an $N^+$-type emitter region and a $P^+$-type first body contact region. The $N^+$-type emitter region and the $P^+$-type first body contact region are formed at a surface layer portion of the first body region. Each of the second-type partial regions has a P-type second body region and a hole stopper layer. The hole stopper layer is formed such that the P-type second body region is divided into a first part adjacent to the front surface of the semiconductor substrate and a second part adjacent to the bottom of the second body region.

That is, the first body region is not formed with the hole stopper layer, and the second body region is not formed with the emitter region. The first body region of the first-type partial region serves as a channel region, and the second body region of the second-type partial region serves as a thinning-out region. The first-type partial regions and the second-type partial regions are alternately arranged in a planer direction along a surface of the semiconductor substrate. Such a semiconductor device is referred to as a thinned-out semiconductor device. In the described semiconductor device, a collector layer is formed along a rear surface of the semiconductor substrate.

In such a semiconductor device, holes injected from the collector layer is accumulated by the hole stopper layer. Therefore, it is possible to increase a hole concentration of the drift layer. Because conductivity modulation is enhanced in the drift layer, an on-state voltage can be reduced. In the second-type partial region having the hole stopper layer, since the emitter region is not formed, a parasitic transistor is not formed. Therefore, it is less likely that latch-up will occur.

SUMMARY

In such a semiconductor device, the on-state voltage can be reduced with an increase in an area density of the hole stopper layer. However, if the area density of the hole stopper layer is excessively increased, breakdown properties will be affected.

Namely, in a case where the area density of the hole stopper layer is low, when a positive voltage is applied to the collector layer, a depletion layer can punch through the hole stopper layer. In this case, therefore, the breakdown properties are not affected. That is, because the hole stopper layer does not serve as a PN junction due to depletion, the breakdown properties are the same level as that of the case where the hole stopper layer is not formed.

On the other hand, in a case where the area density of the hole stopper layer is high, the depletion layer can not be easily spread in the hole stopper layer. That is, the depletion layer cannot punch through the hole stopper layer. Therefore, a non-depleted area remains in the hole stopper layer. In such a case, the PN junction between the non-depleted area of the hole stopper layer and the second part of the second body region is biased in a forward direction. Therefore, a parasitic thyristor provided by the collector layer, the drift layer, the second part, the hole stopper layer and the first part is latched up. Accordingly, the excessive increase in the area density of the hole stopper layer results in the decrease in the breakdown properties.

It is to be noted that the area density of the hole stopper layer is defined by an integrated value of the impurity density of the hole stopper layer. Also, the increase in the area density of the hole stopper layer means an increase in the total amount of the impurity of the hole stopper layer.

It is an object of the present disclosure to provide a semiconductor device capable of reducing an on-state voltage without decreasing the breakdown properties.

According to an aspect of the present disclosure, a semiconductor device includes a first conductivity-type semiconductor substrate, second conductivity-type channel regions, and second conductivity-type thinning-out regions. The channel regions and the thinning-out regions are disposed adjacent to a substrate surface of the semiconductor substrate. The channel regions and the thinning-out regions are arranged in a direction parallel to the substrate surface in such a manner that at least one thinning-out region is disposed between the adjacent channel regions. The semiconductor device further has a first conductivity-type emitter region, a first conductivity-type hole stopper layer, an emitter electrode, a collector layer and a collector electrode. The emitter region is disposed at a surface layer portion of each of the channel regions. The hole stopper layer is disposed in each of the thinning-out regions to divide the thinning-out region into a first part adjacent to the substrate surface and a second part adjacent to a bottom of the thinning-out region. The emitter electrode is connected to the emitter region and the first part. The collector layer is disposed in the semiconductor substrate at a position separated from the channel regions and the thinning-out regions. The collector electrode is electrically connected to the collector layer. The hole stopper layer has an area density of equal to or less than $4.0 \times 10^{12}$ cm$^{-2}$.

In the above semiconductor device, since the area density of the hole stopper layer is equal to or less than $4.0 \times 10^{12}$ cm$^{-2}$, the on-state voltage can be decreased without reducing the breakdown properties.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

First Embodiment

A first embodiment will be described hereinafter with reference to FIGS. 1 through 5.

Figure 1:
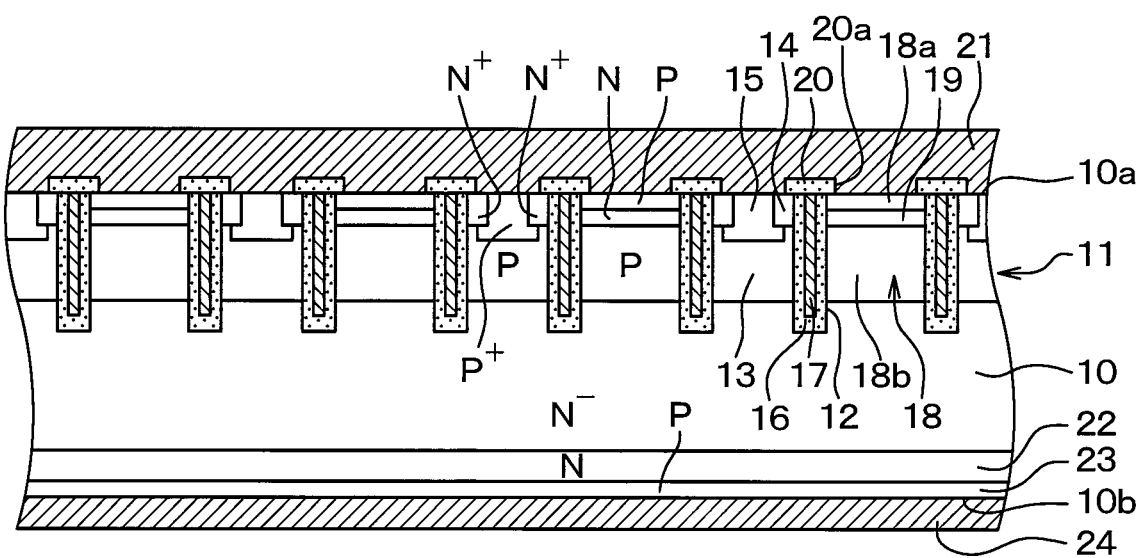
FIG. 1 is a cross-sectional view of a semiconductor device, corresponding to a cross-section taken along a line I-I in FIG. 2, according to a first embodiment.
Figure 2:
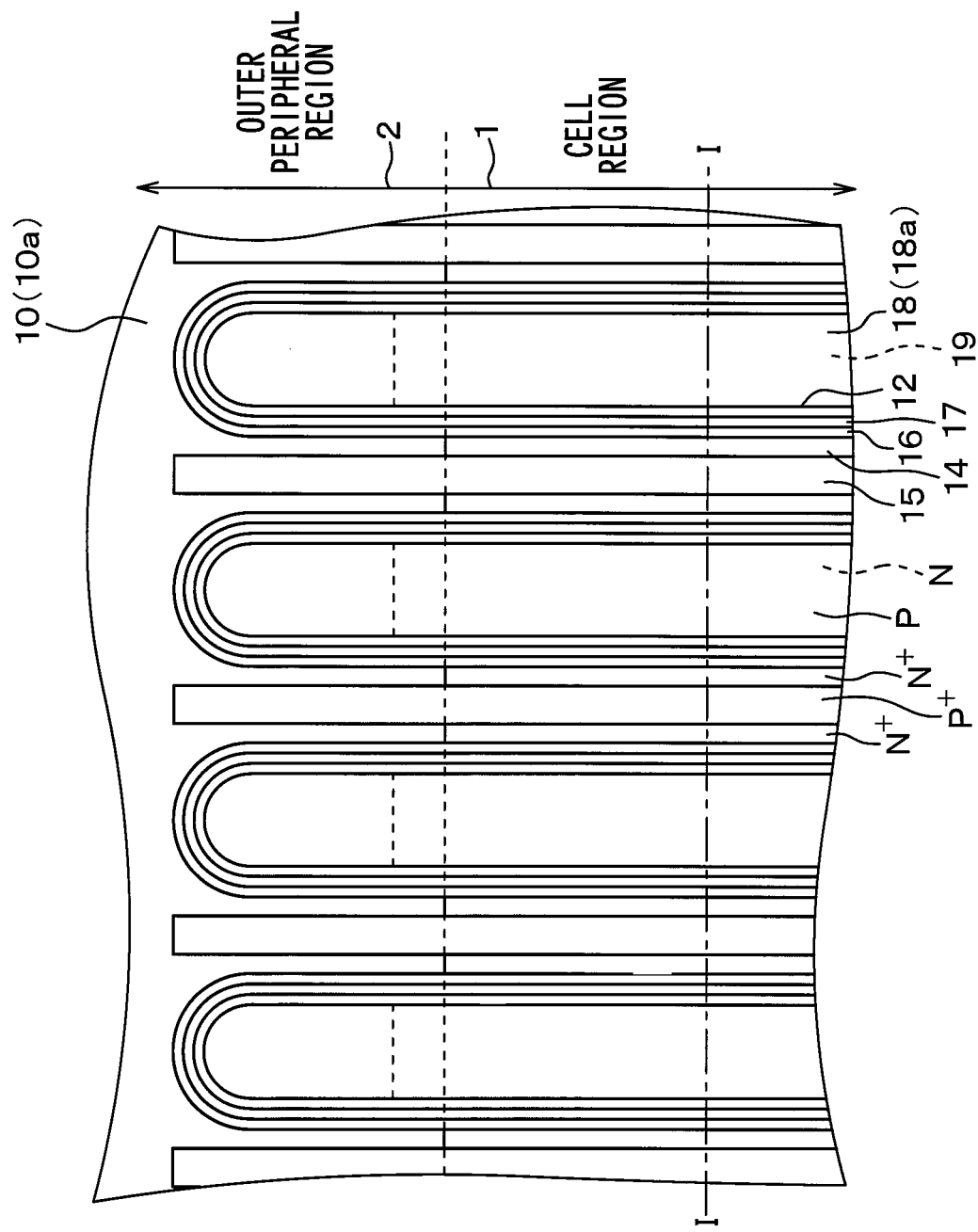
FIG. 2 is a plan view of the semiconductor device shown in FIG. 1.

A semiconductor device according to the first embodiment has an IGBT element, and is, for example, used as a switching element for a power supply circuit such as an inverter. FIG. 1 is a cross-sectional view of the semiconductor device, and FIG. 2 is a plan view of the semiconductor device. Also, FIG. 1 is a cross-sectional view taken along a line I-I in FIG. 2. In FIG. 2, an interlayer insulation film and an emitter electrode are not illustrated.

As shown in FIGS. 1 and 2, the semiconductor device has an $N^-$-type semiconductor substrate 10 serving as a drift layer. The semiconductor substrate 10 includes a cell region 1 and an outer peripheral region 2 on a periphery of the cell region 1. The semiconductor substrate 10 is formed with a P-type base layer 11 along a first surface (substrate surface) 10a of the semiconductor substrate 10. The base layer 11 has a predetermined thickness. The base layer 11 extends from the cell region 1 to the outer peripheral region 2 with respect to a direction along the first surface 10a of the semiconductor substrate 10. Further, multiple trenches 12 are formed to pass through the base layer 11 and reach the semiconductor substrate 10 with respect to a thickness direction (depth direction) of the semiconductor substrate 10. The base layer 11 is divided into multiple regions by the trenches 12.

Each of the trenches 12 extends in the direction along the first surface 10a of the semiconductor substrate 10. In the example of FIG. 1, the trench 12 extends in a direction perpendicular to a paper surface of FIG. 1, which corresponds to an up and down direction in FIG. 2. For example, the trenches 12 are arranged parallel to each other at equal intervals, and ends of adjacent two of the trenches 12 are connected to each other to form a loop shaped-trench. In the present embodiment, the trenches 12 extend from the cell region 1 to the outer peripheral region 2, and the ends of the adjacent two trenches 12 are connected to each other in the outer peripheral region 2.

A P-type channel region 13 is provided by a region of the base layer 11 disposed between the adjacent looped trenches 12. Namely, the P-type channel region 13 is provided by the region of the base layer 11 that is not surrounded by the looped trench 12. $N^+$-type emitter regions 14 are formed in a surface layer portion of the channel region 13. A $P^+$-type body region 15 is formed in the surface layer portion of the channel region 13 and between the emitter regions 14.

The $N^+$-type emitter regions 14 have an impurity concentration higher than that of the $N^-$-type semiconductor substrate 10. The emitter regions 14 are ended within the base layer 11 with respect to the thickness direction of the semiconductor substrate 10, such as an up and down direction of FIG. 1. Namely, the emitter regions 14 are thinner than the base layer 11. Also, the emitter regions 14 are in contact with side surfaces of the trenches 12. The $P^+$-type body region 15 has an impurity concentration higher than that of the P-type channel region 13. Similar to the emitter regions 14, the body region 15 is ended within the base layer 11 with respect to the thickness direction.

Specifically, each of the emitter regions 14 has a bar shape extending in a longitudinal direction of the trench 12. The emitter region 14 is disposed in a region between the adjacent trenches 12, and is in contact with the side surface of the trench 12. Further, the emitter region 14 is ended within the cell region 1 with respect to the longitudinal direction of the trench 12.

The body region 15 has a bar shape. The body region 15 extends in the longitudinal direction of the trench 12 between the emitter regions 14. In other words, the body region 15 extends along the emitter regions 14. The body region 15 extends to the outer peripheral region 2 so as to easily release holes accumulated in the outer peripheral region 2 during an off state.

In each of the trenches 12, a gate insulation film 16 is disposed to cover an inner surface of the trench 12. Further, a gate electrode 17, which is for example made of a poly-silicon or the like, is disposed on the gate insulation film 16. In other words, the trench 12 is filled with the gate insulation film 16 and the gate electrode 17. These trenches 12 provide a trench gate structure.

A region of the base layer 11 disposed in the looped trench 12, that is, the base layer 11 without having the emitter regions 14 provides a thinning-out region 18.

As described above, the base layer 11 is divided into the multiple regions by the trenches 12. The region of the base layer 11 where the emitter regions 14 are formed serves as the channel region 13, and the region of the base layer 11 where the emitter regions 14 are not formed serves as the thinning-out region 18.

The emitter regions 14 are formed in alternate regions of the base layer 11 divided by the trenches 12. That is, the channel regions 13 and the thinning-out region 18 are repeatedly arranged in a predetermined order in the direction along the first surface 10a of the semiconductor substrate 10. In other words, the IGBT elements and dummy elements are alternately arranged. Therefore, the semiconductor device of the present embodiment can be referred to as a semiconductor device with thinned-out type IGBT elements.

The thinning-out region 18 is formed with an N-type hole stopper layer 19. The hole stopper layer 19 divides the thinning-out region 18 into a first part 18a and a second part 18b in the depth direction of the trench 12. The first part 18a is adjacent to an open end of the trench 12, that is, adjacent to the first surface 10a of the semiconductor substrate 10, and the second part 18b is adjacent to a bottom end of the trench 12 (e.g., a lower end in FIG. 1). The first part 18a and the second part 18b are completely isolated from each other in regard to electric potential by the hole stopper layer 19.

The hole stopper layer 19 is formed only in the thinning-out region 18 of the base layer 11, and is not formed in the channel region 13. In other words, the hole stopper layer 19 is not formed in the IGBT element, but is formed in the dummy element that does not have the channel region 13.

The hole stopper layer 19 is located adjacent to the surface layer portion of the thinning-out region 18 with respect to the depth direction of the trench 12, that is, located adjacent to the first surface 10a of the semiconductor substrate 10 in the thinning-out region 18. In the present embodiment, the hole stopper layer 19 is disposed at a depth of 0.5 to 1.0 micrometers (μm) from the first surface 10a, and has a thickness of approximately 0.4 μm.

Figure 3:
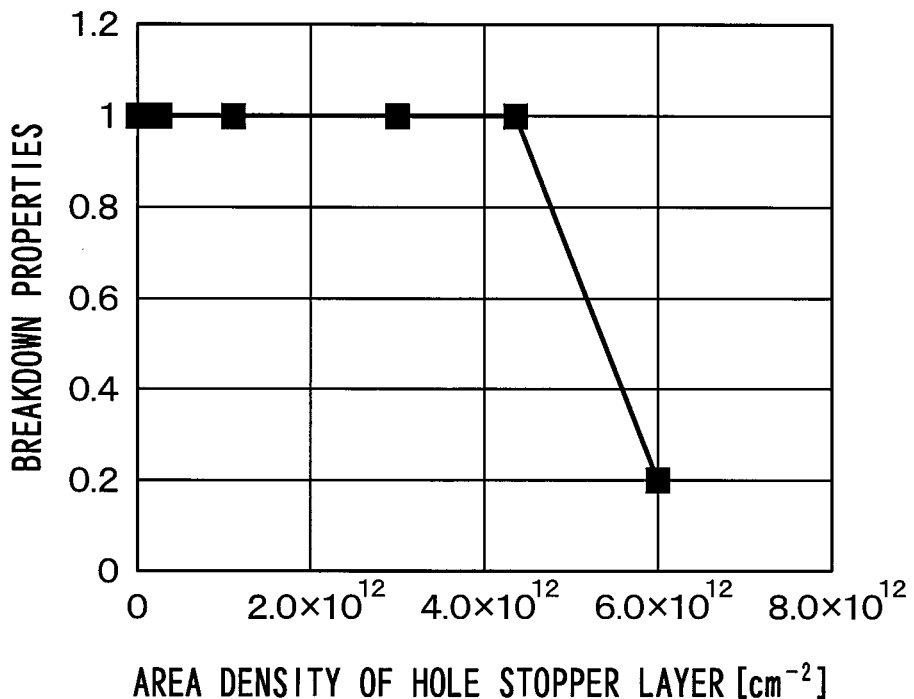
FIG. 3 is a graph illustrating a relationship between an area density of a hole stopper layer and breakdown properties according to the first embodiment.

A relationship between an area density of the hole stopper layer 19 and breakdown properties, such as a breakdown voltage, was simulated by the inventors of the present disclosure. FIG. 3 is a graph illustrating a result of the simulation.

As shown in FIG. 3, it is appreciated that the breakdown properties reduce as the area density becomes greater than $4.0 \times 10^{12}$ cm$^{-2}$. Therefore, the area density of the hole stopper layer 19 is equal to or less than $4.0 \times 10^{12}$ cm$^{-2}$. Here, the area density of the hole stopper layer 19 is defined by an integrated value of impurity density of the hole stopper layer 19.

Figure 4:
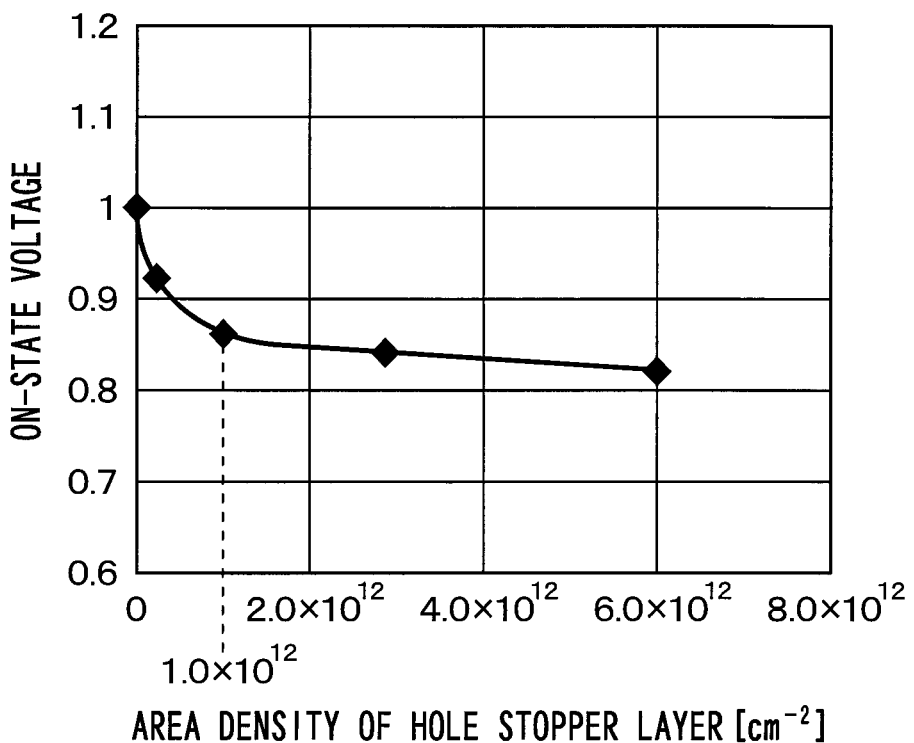
FIG. 4 is a graph illustrating a relationship between the area density of the hole stopper layer and an on-state voltage according to the first embodiment.

Also, a relationship between the area density of the hole stopper layer 19 and the on-state voltage was simulated by the inventors. FIG. 4 is a graph illustrating a result of the simulation. In FIG. 4, the on-state voltage is 1.0 when the area density of the hole stopper layer 19 is 0.0, that is, when the hole stopper layer 19 is not formed.

As shown in FIG. 4, the on-state voltage sharply decreases as the area density of the hole stopper layer 19 increases from 0.0 to $1.0 \times 10^{12}$ cm$^{-2}$. The decrease of the on-state voltage becomes moderate as the area density of the hole stopper layer 19 becomes greater than $1.0 \times 10^{12}$ cm$^{-2}$.

Therefore, the area density of the hole stopper layer 19 is, for example, equal to or greater than $1.0 \times 10^{12}$ cm$^{-2}$ and equal to or less than $4.0 \times 10^{12}$ cm$^{-2}$. In this case, the breakdown properties of the semiconductor device improve while reducing the on-state voltage.

The hole stopper layer 19 is formed from the cell region 1 to the outer peripheral region 2, as shown in FIG. 2. Therefore, the hole stopper layer 19 restricts the holes accumulated at an outer edge portion of the cell region 1, that is, adjacent to a boundary between the cell region 1 and the outer peripheral region 2, from being released from the outer peripheral region 2.

As shown in FIG. 1, an interlayer insulation film 20 such as a boron phosphorous silicate glass (BPSG) film is formed on the base layer 11. The interlayer insulation film 20 has a contact hole 20a to expose a portion of the emitter regions 14, the body region 15 and a portion of the first part 18a of the thinning-out region 18 from the interlayer insulation film 20. An emitter electrode 21 is formed on the interlayer insulation film 20. The emitter electrode 21 is electrically connected to the N$^+$-type emitter regions 14, the P$^+$-type body region 15 and the first part 18a through the contact hole 20a. That is, the emitter electrode 21 is electrically connected to both of the emitter regions 14 and the first part 18a.

Further, an N-type field stop layer 22 is formed on a second surface 10b of the N$^-$-type semiconductor substrate 10, which is opposite to the first surface 10a. A P-type collector layer 23 is formed on an opposite side of the field stop layer 22 from the semiconductor substrate 10, and a collector electrode 24 is formed on the collector layer 23.

The semiconductor device of the present embodiment has the above described structure. Further, the inventors studied about an area density of the first part 18a, and found that, in a case where the area density of the first part 18a is excessively low, punch-through occurs in the first part 18a when a voltage is applied between the collector and the emitter, resulting in the decrease in withstand voltage. It is to be noted that the area density of the first part 18a is defined by an integrated value of impurity density of the first part 18a.

Figure 5:
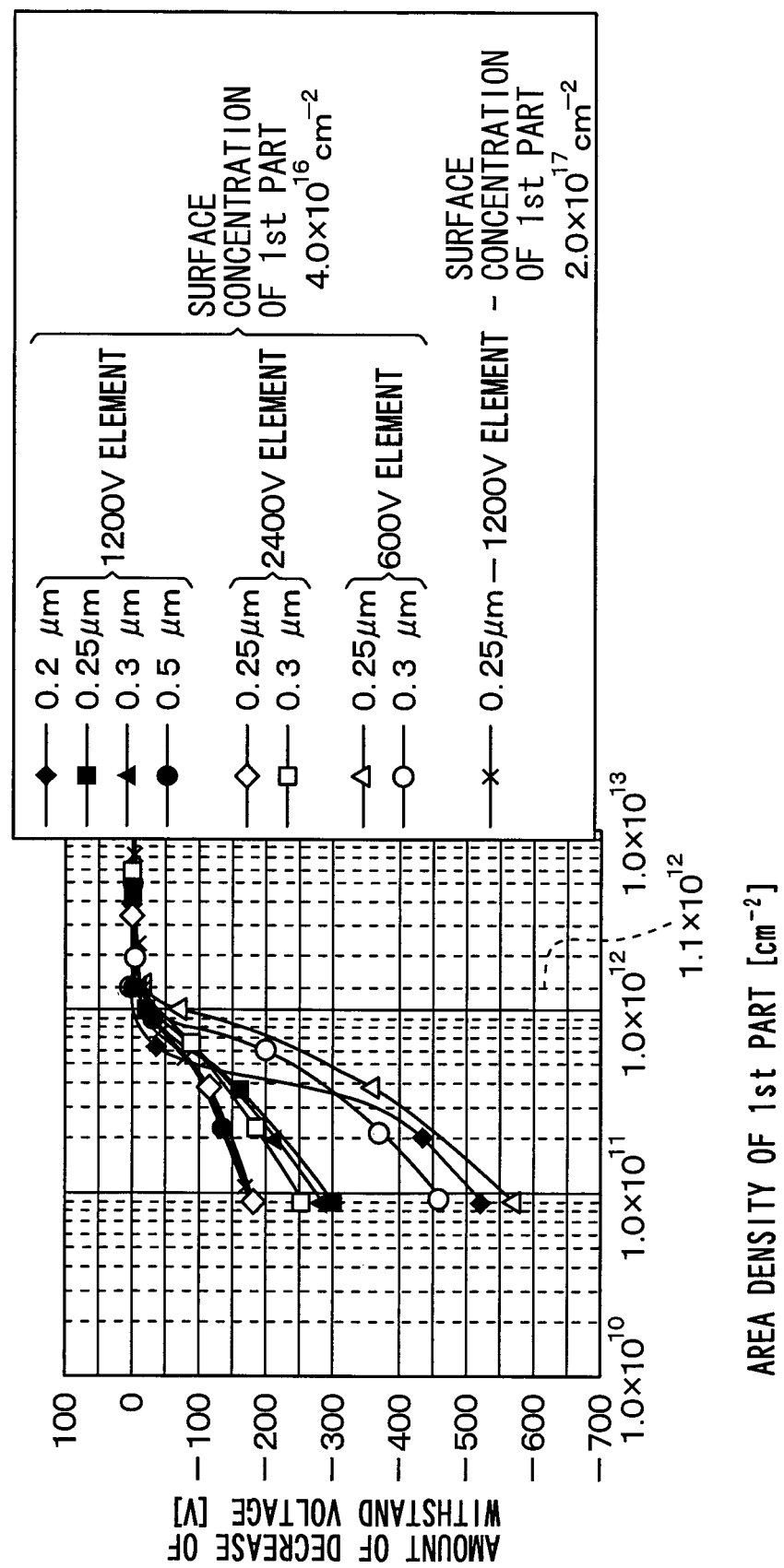
FIG. 5 is a graph illustrating a relationship between an area density of a first part of a thinning-out region and the decrease in withstand voltage according to the first embodiment.

FIG. 5 is a graph illustrating a result of a simulation about a relationship between the area density of the first part 18a and the amount of decrease in withstand voltage. With regard to semiconductor devices used in the simulation, the impurity concentration and the like of the semiconductor substrate 10 are adjusted so that the withstand voltage of the element in a case where the punch-through does not occur in the first part 18a is 2400V, 1200V, and 600V.

With regard to the semiconductor devices having the element withstand voltage of 2400V and 600V, a surface concentration of the first part 18a is $4.0 \times 10^{16}$ cm$^{-2}$. With regard to the semiconductor device having the element withstand voltage of 1200V, the surface concentration of the first part 18a is $4.0 \times 10^{16}$ cm$^{-2}$ or $2.0 \times 10^{17}$ cm$^{-2}$. It is to be noted that the surface concentration of the first part 18a is a concentration of a contact portion of the first part 18a with the emitter electrode 21. In the simulation, the depth of the hole stopper layer 19 is 0.2 to 0.5 μm in each of the semiconductor devices. In FIG. 5, a vertical axis represents the amount of decrease in the withstand voltage, and a horizontal axis represents the area density of the first part 18a in logarithm. The amount of decrease in the withstand voltage when the punch-through does not occur in the first part 18a is defined as 0.

As shown in FIG. 5, it is appreciated that the amount of decrease in the withstand voltage sharply increases as the area density of the first part 18a becomes smaller than $1.1 \times 10^{12}$ cm$^{-2}$. The followings are reasons of the above characteristics.

In the device having the hole stopper layer 19, a PN junction is provided by the first part 18a and the hole stopper layer 19. When the voltage is applied between the collector and the emitter, the depletion layer expands toward both of the first part 18a and the hole stopper layer 19. At this time, the depletion layer easily expands as the area density of the first part 18a is low. When the area density of the first part 18a is lower than $1.1 \times 10^{12}$ cm$^{-2}$, the depletion layer 18a reaches the surface of the first part 18a, that is, the first surface 10a of the semiconductor substrate 10. That is, the device becomes in a state equivalent to the structure where the hole stopper layer 19 is connected to the emitter electrode 21, and thus a thyristor is formed.

Therefore, the withstand voltage decreases when the area density of the first part 18a is lower than $1.1 \times 10^{12}$ cm$^{-2}$. In other words, the amount of decrease in the withstand voltage increases. In the present embodiment, therefore, the area density of the first part 18a is equal to or greater than $1.1 \times 10^{12}$ cm$^{-2}$, for example. In this case, the element withstand voltage becomes stable.

Further, as shown in FIG. 5, the amount of decrease in the withstand voltage increases almost similarly in the semiconductor devices irrespective of the element withstand voltage (e.g., the impurity concentration of the semiconductor substrate 10), the depth of the hole stopper layer 19 and the surface concentration of the first part 18a.

In the present embodiment, for example, "N-type", "N⁻-type" and "N⁺-type" correspond to a first conductivity-type, and "P-type" and "P⁺-type" correspond to a second conductivity-type.

Next, a method of manufacturing the above described semiconductor device will be described.

First, an N⁻-type wafer is prepared, and the base layer 11 is formed at the surface of the wafer by a thermal diffusion technique. Then, the trench-gate structure is formed in respective areas of the wafer where the semiconductor devices are to be formed. The trench gate structure is formed by a known method. In forming the trench-gate structure, the trenches 12 are formed to reach the semiconductor substrate 10 through the base layer 11, and the gate insulation film 16 is formed on the inner surface of each trench 12. Further, a poly-silicon as the gate electrode 17 is formed on the gate insulation film 16 in the trench 12.

Next, a mask having openings at positions corresponding to the positions of the emitter regions 14 is placed on the wafer, and ion implantation of the N-type impurity is performed using the mask. After the mask is removed from the wafer, another mask having openings at positions corresponding to the positions of the body regions 15 is placed on the wafer, and ion implantation of the P-type impurity is performed using the mask. After the mask is removed from the wafer, the impurities are activated by a thermal treatment. Thus, the N⁺-type emitter regions 14 and the P⁺-type body regions 15 are formed.

Next, a mask having openings at positions corresponding to the positions of the hole stopper layer 19 is placed on the wafer, and ion implantation and a thermal treatment are performed using the mask to form the hole stopper layers 19 in the portions of the base layer 11 where the thinning-out regions 18 are to be formed. For example, phosphorous (P) as dopant is ion-implanted, and activated by a thermal treatment at the temperature of 900 degrees Celsius (° C.) or higher. Thus, the hole stopper layer 19 is formed.

In this case, the acceleration voltage and the dose amount are suitably adjusted so that the hole stopper layer 19 has the area density of equal to or greater than $1.0 \times 10^{12}$ cm⁻² and equal to or less than $4.0 \times 10^{12}$ cm⁻², and the first part 18a has the area density of equal to or greater than $1.1 \times 10^{12}$ cm⁻².

As another example, the first part 18a having the area density of equal to or greater than $1.1 \times 10^{12}$ cm⁻² is formed by ion-implanting boron (B) in the first part 18a and thermally treating after the hole stopper layer 19 having the area density of equal to or greater than $1.0 \times 10^{12}$ cm⁻² and equal to or less than $4.0 \times 10^{12}$ cm⁻² is formed by the ion implantation of phosphorous (P) and the thermal treatment.

Next, the interlayer insulation film 20 is formed on the base layer 11, and the contact hole 20a is formed in the base layer 11 to expose the part of the emitter regions 14, the body region 15 and the part of the first part 18a of the thinning-out region 18 from the interlayer insulation film 20. Then, the emitter electrode 21 is formed on the base layer 11 so that the emitter region 14, the body region 15 and the first area 18a are electrically connected to the emitter electrode 21 through the contact hole 20a.

Further, the N-type field stop layer 22 is formed on the rear surface of the wafer, and the P-type collector layer 23 is formed on the field stop layer 22. Moreover, the collector electrode 24 is formed on the collector layer 23. Thereafter, when the wafer is cut into dice, the semiconductor device 1 as shown in FIG. 1 is produced.

As described above, in the present embodiment, the area density of the hole stopper layer 19 is equal to or greater than $1.0 \times 10^{12}$ cm⁻² and equal to or less than $4.0 \times 10^{12}$ cm⁻². Therefore, the on-state voltage can be reduced without decreasing the breakdown properties as shown in FIGS. 3 and 4. Further, in the case where the first part 18a has the area density of equal to or greater than $1.1 \times 10^{12}$ cm⁻², the withstand voltage becomes stable as shown in FIG. 5.

Second Embodiment

A second embodiment will be hereinafter described with reference to FIGS. 6 through 8. A semiconductor device according to the second embodiment relates to a semiconductor device with an RC-IGBT element. That is, the semiconductor device according to the second embodiment has a diode element in addition to the IGBT element. Other structures of the second embodiment are similar to those of the first embodiment. Hereinafter, a structure different from the first embodiment will be mainly described.

Figure 6:
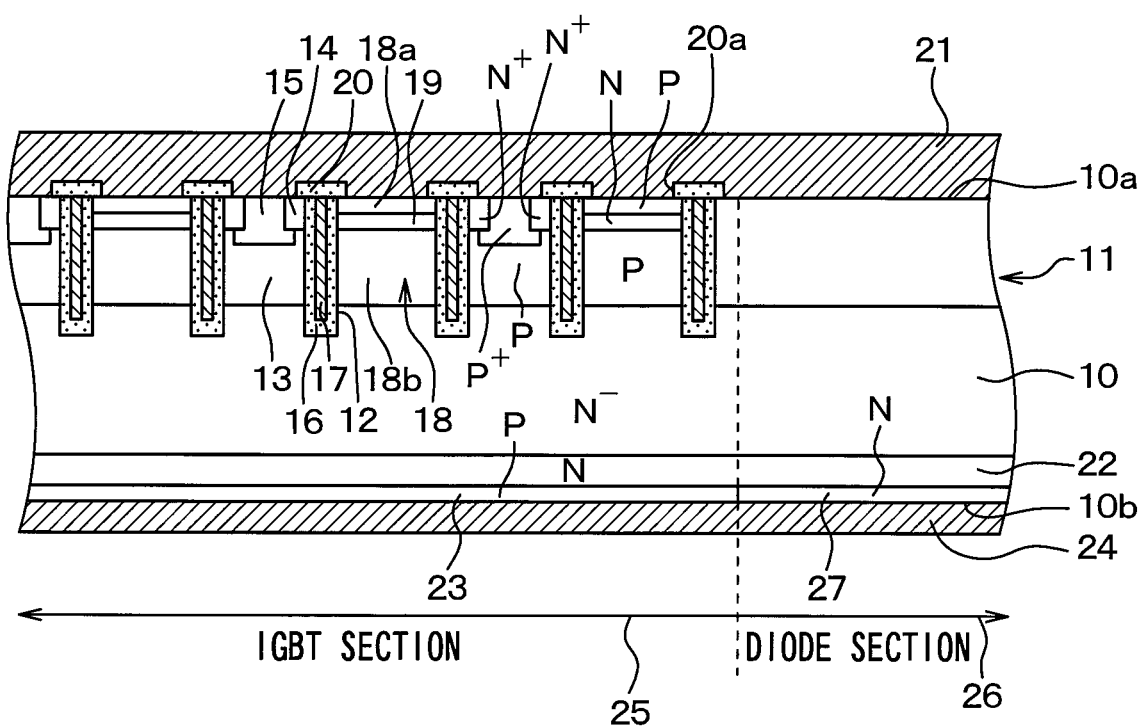
FIG. 6 is a cross-sectional view of a semiconductor device, corresponding to a cross-section taken along a line VI-VI in FIG. 7, according to a second embodiment.
Figure 7:
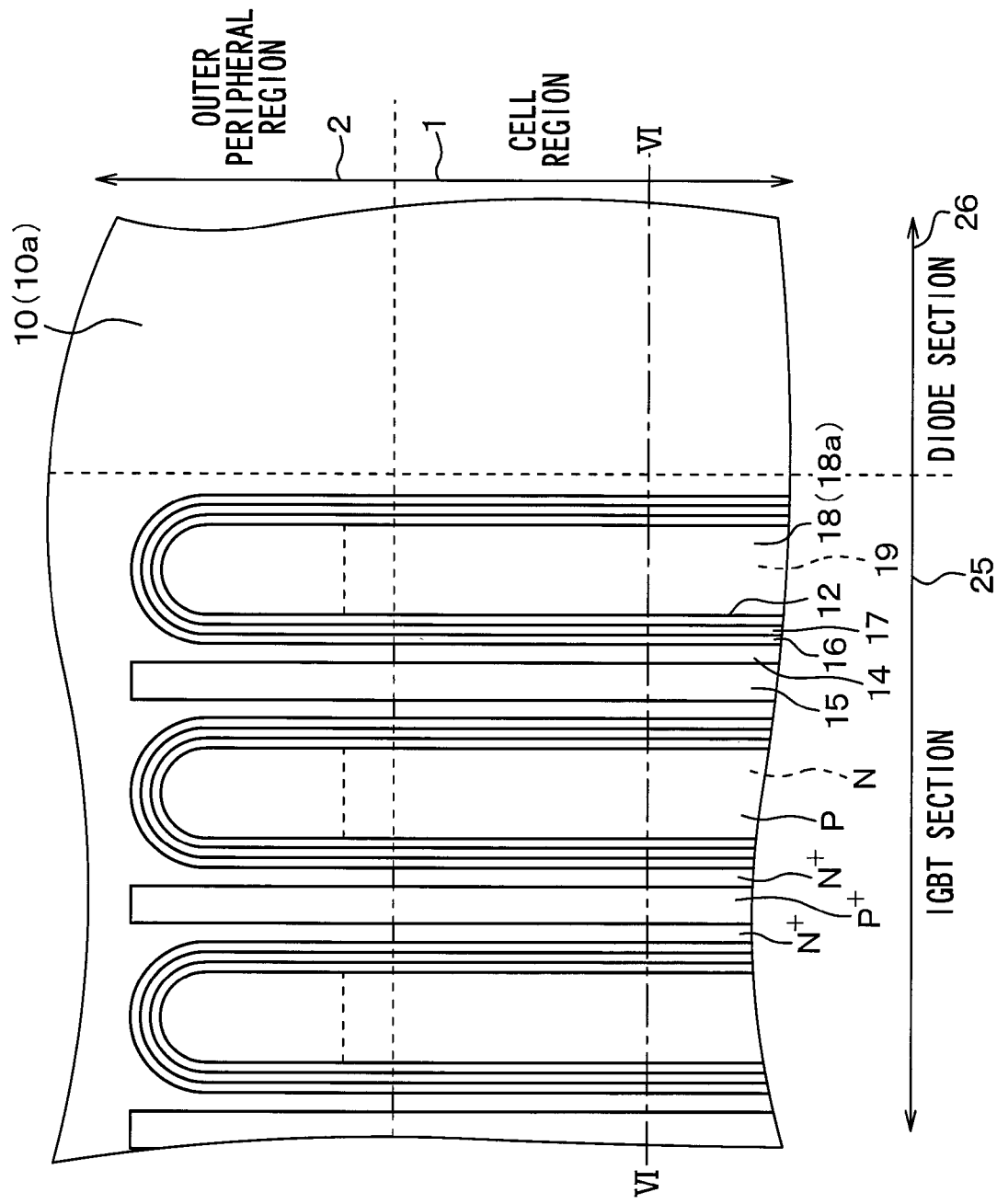
FIG. 7 is a plan view of the semiconductor device shown in FIG. 6.

FIG. 6 is a cross-sectional view of the semiconductor device, and FIG. 7 is a plan view of the semiconductor device shown in FIG. 6. Also, FIG. 6 corresponds to a cross-sectional view taken along a line VI-VI in FIG. 7. In FIG. 7, the interlayer insulation film 20 and the emitter electrode 21 are not illustrated.

As shown in FIGS. 6 and 7, the semiconductor device has an IGBT section 25 forming the IGBT element and a diode section 26 forming the diode element.

Specifically, in the IGBT section 25, the collector layer 23 is formed on a side opposite to the field stop layer 22 from the semiconductor substrate 10. Thus, in the IGBT section 25, the holes are supplied from the collector layer 23.

In the diode section 26, an N-type cathode layer 27 is formed on a side opposite to the field stop layer 22 from the semiconductor substrate 10. That is, the IGBT section 25 and the diode section 26 are defined according to whether the layer formed on the field stop layer 22 is either the collector layer 23 or the cathode layer 27. In the diode section 26, the trench gate structure, the emitter region 14 and the hole stopper layer 19 are not formed at the side adjacent to the first surface 10a.

With respect to the direction along the first surface 10a of the semiconductor substrate 10, the IGBT section 25 having the collector layer 23 is operated as the IGBT element, and the diode section 26 having the cathode layer 27 is operated as the diode element. That is, the collector electrode 24 also serves as the cathode electrode.

In the IGBT section 25, a region of the base layer 11 that is divided by the trench gate structure and located nearest to the diode section 26 is formed as the thinning-out region 18. Therefore, as compared with a case where a region of the base layer 11 located nearest to the diode section 26 is formed as the channel region 13, the holes accumulated at the outer end portion of the IGBT section 25 are not easily released. As such, the on-state voltage can be reduced.

In the above-described semiconductor device with the RC-IGBT element, the amount of hole injected during an operation of the diode increases with an increase in the area density of the first part 18a, resulting in the increase in a peak value of the recovery current. A relationship between the area density of the first part 18a and the peak current was simulated by the inventors. FIG. 8 is a graph illustrating a result of the simulation about the relationship between the area density of the first part 18a and the peak value of the recovery current.

Figure 8:
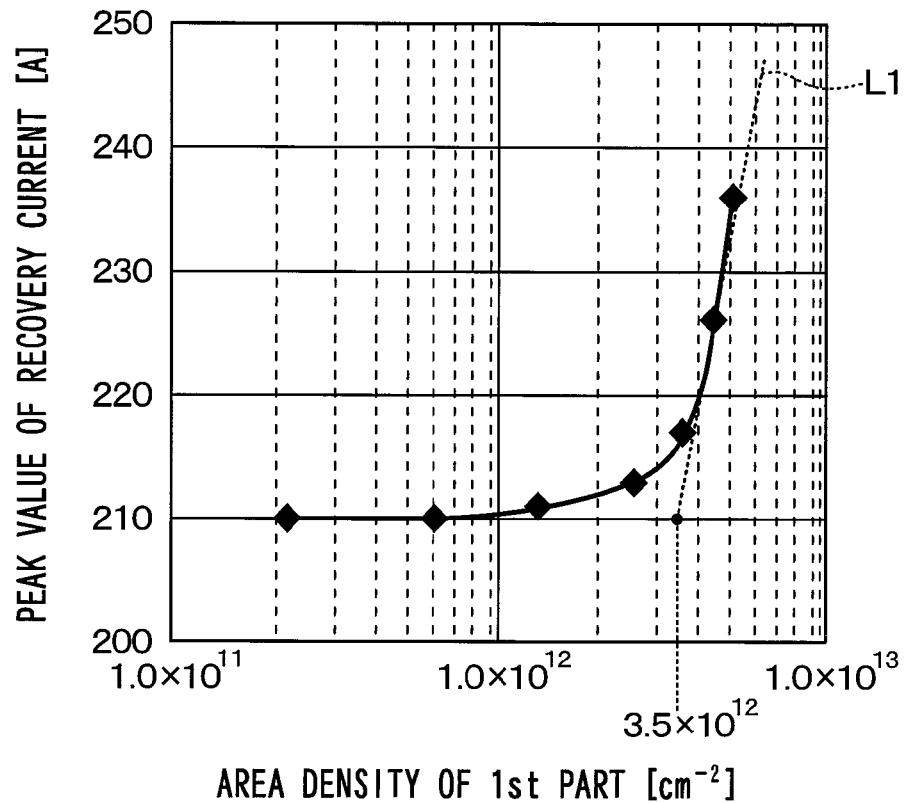
FIG. 8 is a graph illustrating a relationship between an area density of a first part of a thinning-out region and a peak value of a recovery current according to the second embodiment.

As shown in FIG. 8, the peak value of the recovery current is minimum at 210A and increases gradually from 210A with an increase in the area density of the first part 18a. Specifically, a line L1 tangential to a portion the characteristic curve of the peak value where the peak value sharply rises intersects the peak value of 210A when the area density is $3.5 \times 10^{12}$ cm$^{-2}$ The peak value of the recovery current sharply rises as the area density of the first part 18a increases from $3.5 \times 10^{12}$ cm$^{-2}$. In the present embodiment, therefore, the area density of the first part 18a is equal to or greater than $1.1 \times 10^{12}$ cm$^{-2}$ and equal to or less than $3.5 \times 10^{12}$ cm$^{-2}$.

In this way, the present disclosure is adoptable to the semiconductor device with the RC-IGBT element. In the semiconductor device with the RC-IGBT element, when the area density of the first part 18a is equal to or greater than $1.1 \times 10^{12}$ cm$^{-2}$ and equal to or less than $3.5 \times 10^{12}$ cm$^{-2}$, the peak value of the recovery current can be reduced and switching loss can be reduced.

Third Embodiment

A third embodiment will be described hereinafter with reference to FIG. 9. In a semiconductor device according to the third embodiment, the hole stopper layer 19 is also formed in the diode section 26, in addition to the structure of the second embodiment. Other structures of the semiconductor device of the third embodiment are similar to those of the second embodiment. Hereinafter, the different structure will be mainly described.

Figure 9:
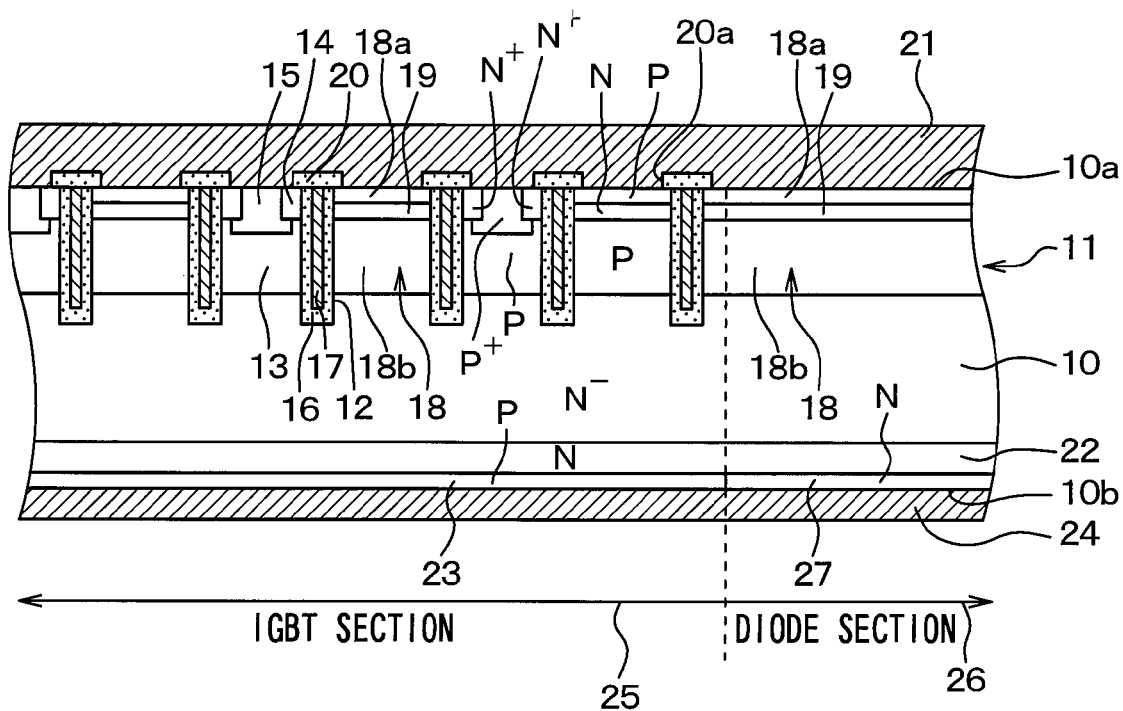
FIG. 9 is a cross-sectional view of a semiconductor device according to a third embodiment.

As shown in FIG. 9, the hole stopper layer 19 is formed in the base layer 11 of the diode section 26 adjacent to the first surface 10a of the semiconductor substrate 10. Namely, the base layer 11 of the diode section 26 serves as the thinning-out region 18 of the IGBT section 25.

In the present embodiment, a lifetime killer is formed by radiating electron beam, a helium line, proton or the like to the semiconductor substrate 10 (drift layer).

As described above, in addition to the IGBT section 25, the hole stopper layer 19 is formed in the diode section 26. Therefore, the amount of holes injected during an operation of the diode can be reduced. With this, the peak value of the recovery current can be further reduced, and the switching loss can be reduced. In addition, since the amount of holes injected during the operation of the diode can be reduced, designing flexibility improves.

Since the lifetime killer is formed in the semiconductor substrate 10 (drift layer), the lifetime of carriers during the operation of the diode can be shortened. Namely, the amount of holes injected can be reduced by the hole stopper layer 19, and the lifetime of the carriers can be shortened by the lifetime killer. Accordingly, the switching loss can be further reduced.

To form the hole stopper layer 19 of the diode section 26, for example, the shape of the mask used for forming the hole stopper layer 19 in the IGBT section 25 is changed. The hole stopper layer 19 of the diode section 26 is formed by the iron implantation and the thermal treatment using the mask. Therefore, the number of steps of the manufacturing method is not particularly increased.

In the example shown in FIG. 9, the hole stopper layer 19 is formed entirely in the diode section 26. Alternatively, the hole stopper layer 19 may be partly formed in the diode section 26.

Fourth Embodiment

A fourth embodiment will be described hereinafter with reference to FIG. 10. In a semiconductor device according to the fourth embodiment, the diode section 26 has the trench gate structure, in addition to the structure of the third embodiment. Other structures of the semiconductor device of the fourth embodiment are similar to those of the third embodiment. Hereinafter, the different structure will be mainly described.

Figure 10:
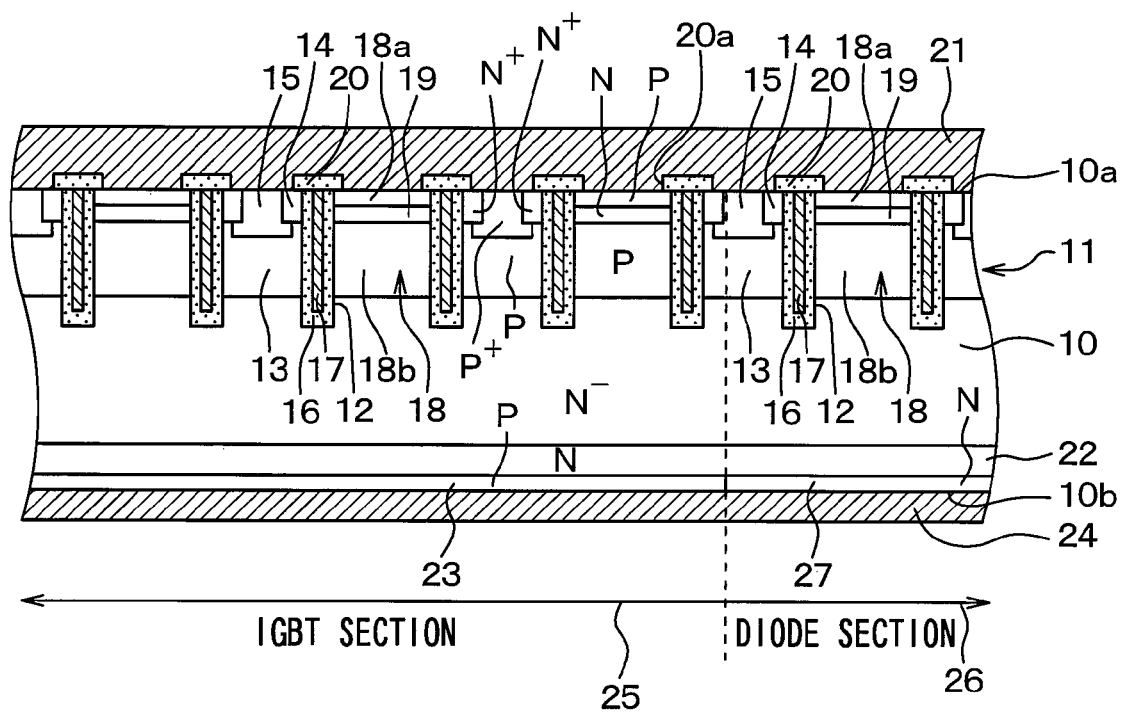
FIG. 10 is a cross-sectional view of a semiconductor device according to a fourth embodiment.

As shown in FIG. 10, the trench gate structure is formed also in the diode section 26. Thus, the diode section 26 is provided with the channel region 13 and the thinning-out region 18. The emitter regions 14 and the body region 15 are formed in the channel region 13, and the hole stopper layer 19 is formed in the thinning-out region 18.

As described above, the trench gate structure is formed in the diode section 26, in addition to the IGBT section 25. Therefore, the cell serving as the IGBT element can be increased, and IGBT efficiency improves. The trench gate structure of the diode section 26 is formed at the same time as forming the trench gate structure of the IGBT section 25. Therefore, the number of steps of the manufacturing method does not particularly increase.

Fifth Embodiment

A fifth embodiment will be hereinafter described with reference to FIG. 11. A semiconductor device according to the fifth embodiment has a vertical-type planer IGBT element, whereas the semiconductor devices according to the above described embodiments have the vertical-type trench gate IGBT element constructed by embedding the gate insulation film 16 and the gate electrode 17 in the trench 12. Namely, the configuration forming the hole stopper layer 19 can be adopted to the semiconductor device having the planer IGBT element.

Figure 11:
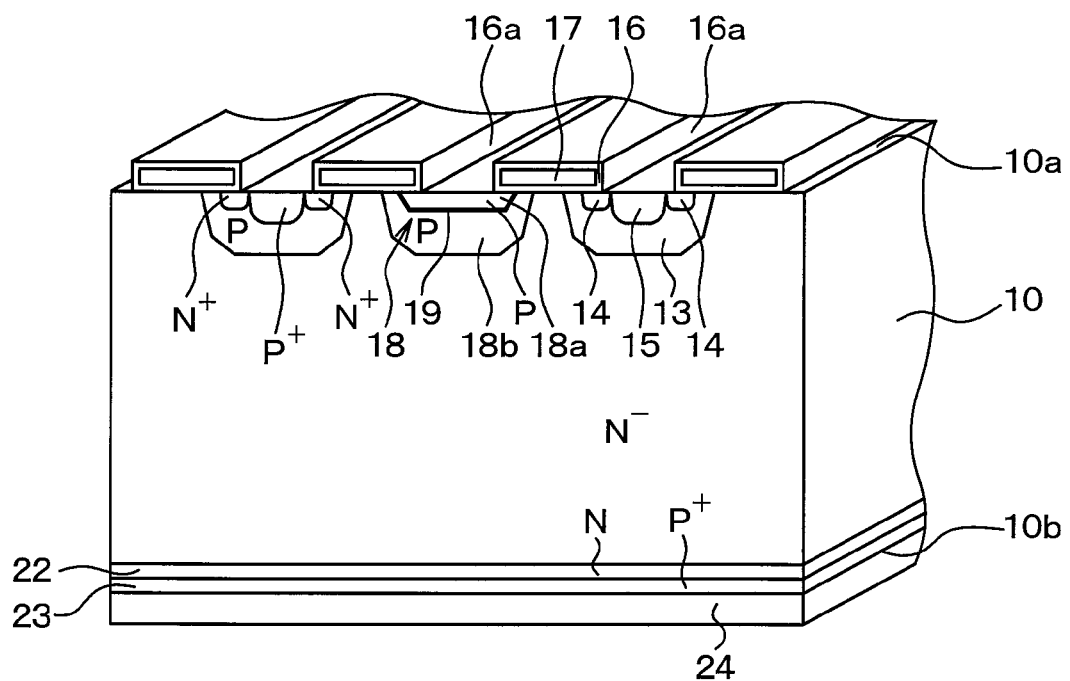
FIG. 11 is a schematic sectional view of a semiconductor device according to a fifth embodiment.

As shown in FIG. 11, P-type regions are formed in the N$^-$-type semiconductor substrate 10 adjacent to the first surface 10a. Each of the P-type regions is formed into a stripe shape extending in the planer direction along the first surface 10a of the semiconductor substrate 10. The P-type regions are formed to correspond to the channel regions 13 and the thinning-out regions 18. The channel regions 13 and the thinning-out regions 18 are alternately arranged in a direction (e.g., a right and left direction in FIG. 11) parallel to the first surface 10a of the semiconductor substrate 10.

Further, the N$^+$-type emitter regions 14 are formed at the surface layer portion of the channel region 13, along the channel region 13. The emitter regions 14 are separated from each other in the channel region 13, and the P$^+$-type body region 15 is formed between the emitter regions 14.

In the thinning-out region 18, the N-type hole stopper layer 19 is formed to divide the thinning-out region 18 into the first part 18a adjacent to the first surface 10a of the semiconductor substrate 10 and the second part 18b adjacent to the second surface 10b of the semiconductor substrate 10. Specifically, the hole stopper layer 19 is formed such that both ends of the hole stopper layer 19 reach the first surface 10a of the semiconductor substrate 10. As such, the thinning-out region 18 is fully divided into the two sections. In FIG. 11, the hole stopper layer 19 is illustrated with a thick line.

Also in the present embodiment, the area density of the hole stopper layer 19 is equal to or greater than $1.0 \times 10^{12}$ cm$^{-2}$ and a most $4.0 \times 10^{12}$ cm$^{-2}$, and the area density of the first part 18a is equal to or greater than $1.1 \times 10^{12}$ cm$^{-2}$.

The gate insulation film 16 is formed on the first surface 10a of the semiconductor substrate 10. The gate insulation film 16 is formed with the contact holes 16c so that the body region 15 and the part of the emitter region 14 of the channel region 13, and the part of the first part 18a of the thinning-out region 18 are exposed from the gate insulation film 16. The gate electrode 17 is formed on the gate insulation film 16. The gate electrode 17 is covered with the gate insulation film 16.

Although not illustrated in FIG. 11, the emitter electrode 21 is disposed on the gate insulation film 16, and is in contact with the body region 15, the emitter region 14 and the first part 18a, which are exposed from the gate insulation film 16.

The field stop layer 22, the collector layer 23 and the collector electrode 24 are formed on the second surface 10b of the semiconductor 10 in this order.

As described above, the present disclosure is adoptable to the semiconductor device having the planer IGBT element structure. Also in the semiconductor device having the planer IGBT element structure, the breakdown properties can be improved by the hole stopper layer 19 having the area density of equal to or less than $4.0 \times 10^{12}$ cm$^{-2}$.

Other Embodiments

In the above described embodiments, the trench 12 has the looped shape. The thinning-out region 18 is provided by the portion of the base layer 11 surrounded by the looped trench 12, and the channel region 13 is provided by the portion of the base layer 11 disposed between the adjacent trenches 12. However, such a layout of the trench 12 is an example. The trench 12 may have any other layout.

For example, the structure of the trench gate-type RC-IGBT element can be adopted to the planer RC-IGBT element by combining the above described second embodiment and the above described fifth embodiment. Similarly, a planer semiconductor device having the hole stopper layer 19 in the diode section 26 may be provided by combining the above described fifth embodiment with the above described third embodiment. Also, a planer semiconductor device having the hole stopper layer 19 and the trench gate structure in the diode section 26 may be provided by combining the above described fifth embodiment with the above described fourth embodiment.

In the above described second embodiment, the lifetime killer may be formed in the semiconductor substrate 10 (drift layer), similar to the above described third embodiment.

In the above described first embodiment, the channel regions 13 and the thinning-out regions 18 are alternately arranged. As another example, the channel regions 13 and the thinning-out regions 18 may be arranged as shown in FIG. 12.

Figure 12:
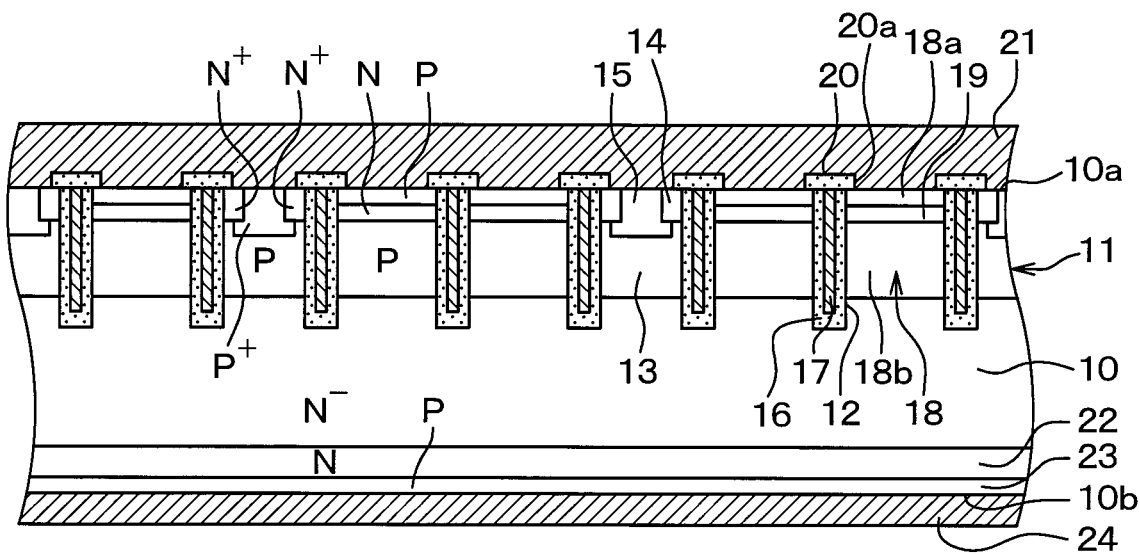
FIG. 12 is a cross-sectional view of a semiconductor device according to another embodiment.

In a semiconductor device shown in FIG. 12, two thinning-out regions 18 are formed between the adjacent two channel regions 13. As further another example, three or more thinning-out regions 18 may be formed between the adjacent two channel regions 13. Namely, the number of the thinning-out regions 18 formed between the adjacent two channel regions 13 is not particularly limited. Also in the above described second through fifth embodiments, the number of the thinning-out regions 18 formed between the adjacent channel regions 13 may be any number.

Figure 13:
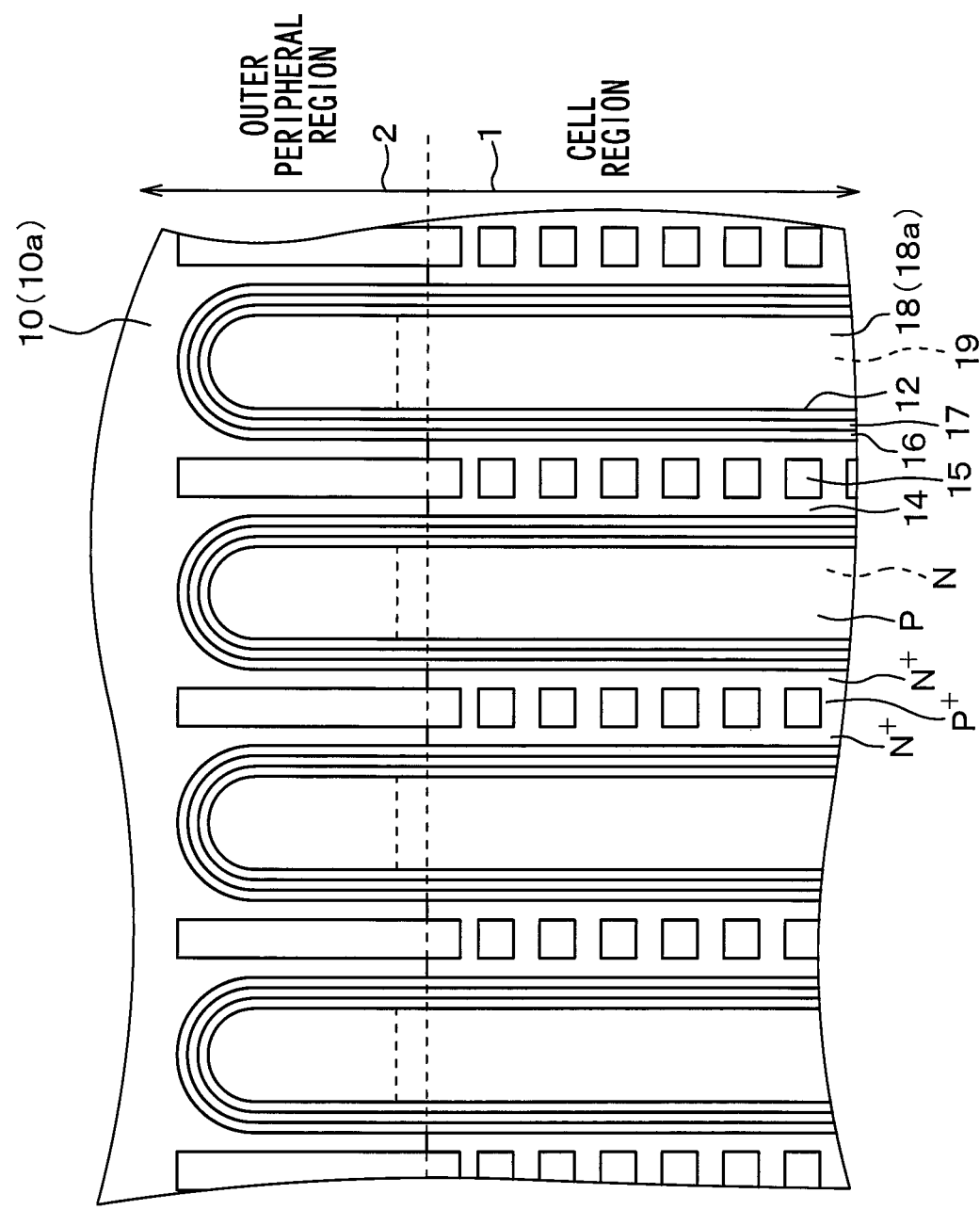
FIG. 13 is a plan view of a semiconductor device according to further another embodiment.

In the above described first embodiment, the emitter regions 14 have the bar shape and disposed along the side surfaces of the trenches 12. Also, the body region 15 has the bar shape and is disposed along and between the two emitter regions 14. Such an arrangement may be modified as shown in FIG. 13. In FIG. 13, the interlayer insulation film 20 and the emitter electrode 21 are not illustrated.

As shown in FIG. 13, the emitter regions 14 may be formed into a ladder pattern. In other words, the adjacent two emitter regions 14 have connecting regions therebetween in the longitudinal direction of the trench 12. Also, the body region 15 may be separated into multiple portions in the longitudinal direction of the trench 12. In this case, the emitter electrode 21 is connected alternately to the emitter regions 14 and the body regions 15 in the longitudinal direction of the trench 12.

Therefore, a distance between the adjacent trenches 12 can be reduced. Therefore, the on-state voltage can be further reduced.

In the above described embodiments, the present disclosure is adopted to the vertical semiconductor device in which the electric current flows in a thickness direction of the semiconductor substrate 10. As another example, the present disclosure may be adopted to a lateral semiconductor device in which the electric current flows in a planer direction of the semiconductor substrate 10. Namely, the collector layer 23 is formed at a position separated from the base layer 11 (the channel region 13 and the thinning-out region 18) disposed adjacent to the first surface 10a of the semiconductor substrate 10.

Summarizing the above described embodiments, a semiconductor device includes a first conductivity-type semiconductor substrate 10 having a substrate surface 10a, second conductivity-type channel regions 13 disposed adjacent to the substrate surface 10a, and second conductivity-type thinning-out regions 18 disposed adjacent to the substrate surface 10a. The thinning-out regions 18 and the channel regions 13 are arranged in a direction parallel to the substrate surface 10a in such a manner that at least one thinning-out region 18 is disposed between the adjacent channel regions 13. The semiconductor device further has a first conductivity-type emitter region 14 disposed at a surface layer portion of each of the channel regions 13, and a first conductivity-type hole stopper layer 19 disposed in each of the thinning-out regions 18. The hole stopper layer 19 is disposed to divide the thinning-out region 18 into a first part 18a adjacent to the substrate surface 10a and a second part 18b adjacent to a bottom of the thinning-out region 18. Further, an emitter electrode 21 is connected to the emitter region 14 and the first part 18a. A collector layer 23 is disposed in the semiconductor substrate 10 at a position separated from the channel regions 13 and the thinning-out regions 18. A collector electrode 24 is electrically connected to the collector layer 23. Moreover, the hole stopper layer 19 has an area density of equal to or less than $4.0 \times 10^{12}$ cm$^{-2}$.

In the above semiconductor device, since the area density of the hole stopper layer 19 is equal to or less than $4.0 \times 10^{12}$ cm$^{-2}$, the on-state voltage can be decreased without reducing the breakdown properties.

For example, the first part 18a may have an area density of equal to or greater than $1.1 \times 10^{12}$ cm$^{-2}$. In this case, an occurrence of punch-through in the first part 18a is restricted.

For example, the semiconductor device may be configured as a semiconductor device with an RC-IGBT element including an IGBT section and a diode section. Namely, the collector layer 23 provides a first conductivity-type cathode layer 27 at a part, and the semiconductor substrate 10 includes a IGBT section 25 serving as an IGBT element and a diode section 26 serving as a diode element with respect to a direction parallel to the substrate surface 10a. The IGBT section 25 is defined by a section including the collector layer 23 other than the cathode layer 27, and the diode section 26 is defined by a section including the cathode layer 27.

In the above semiconductor device with the RC-IGBT element, for example, the area density of the first part 18a may be equal to or less than $3.5 \times 10^{12}$ cm$^{-2}$ In such a case, an excess increase in the peak value of the recovery current is restricted, and the switching loss is reduced.

In addition, the hole stopper layer 19 may be also formed in the diode section 26. In such a case, the amount of holes injected to the diode section 26 during an operation of the diode can be reduced. Therefore, the increase in the peak value of the recovery current is restricted, and the switching loss can be reduced. Moreover, a lifetime killer may be formed in a region of the semiconductor substrate 10 serving as a drift layer. In such a case, the switching loss can be further reduced.

Further, the semiconductor device may be configured to have a trench gate structure. Namely, the semiconductor substrate 10 has a second conductivity-type base layer 11 adjacent to the substrate surface 10a, and trenches 12 passing through the base layer 11 to divide the base layer 11 into multiple regions. In this case, the channel regions 13 and the thinning-out regions 18 are provided by the multiple regions of the base layer 11 divided by the trenches 12. Each of the trenches 12 is filled with a gate insulation film 16 and a gate electrode 17. The gate insulation film 16 is disposed on a wall surface of the trench 12, and the gate electrode 17 is disposed on the gate insulation film 16.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A semiconductor device comprising:
a first conductivity-type semiconductor substrate having a substrate surface;
a plurality of second conductivity-type channel regions disposed adjacent to the substrate surface;
a plurality of second conductivity-type thinning-out regions disposed adjacent to the substrate surface, the thinning-out regions and the channel regions being arranged in a direction parallel to the substrate surface in such a manner that at least one thinning-out region is disposed between the adjacent channel regions;
a first conductivity-type emitter region disposed at a surface layer portion of each of the channel regions;
a first conductivity-type hole stopper layer disposed in each of the thinning-out regions to divide the thinning-out region into a first part adjacent to the substrate surface and a second part adjacent to a bottom of the thinning-out region;
an emitter electrode connected to the emitter region and the first part;
a collector layer disposed in the semiconductor substrate at a position separated from the channel regions and the thinning-out regions; and
a collector electrode electrically connected to the collector layer, wherein
the hole stopper layer has an area density of equal to or less than $4.0 \times 10^{12}$ cm$^{-2}$.

2. The semiconductor device according to claim 1, wherein the first part has an area density of equal to or greater than $1.1 \times 10^{12}$ cm$^{-2}$.

3. The semiconductor device according to claim 1, wherein the collector layer provides a first conductivity-type cathode layer at a part, and
the semiconductor substrate includes an IGBT section serving as an IGBT element and a diode section serving as a diode element with respect to a direction parallel to the substrate surface, the IGBT section being defined by a section including the collector layer other than the cathode layer, the diode section being defined by a section including the cathode layer.

4. The semiconductor device according to claim 3, wherein the area density of the first part is equal to or less than $3.5 \times 10^{12}$ cm$^{-2}$.

5. The semiconductor device according to claim 3, wherein the hole stopper layer is disposed also in the diode section.

6. The semiconductor device according to claim 3 wherein the semiconductor substrate includes a drift region serving as a drift layer, and
the drift region is formed with a lifetime killer.

7. The semiconductor device according to claim 1, wherein the semiconductor substrate has a second conductivity-type base layer adjacent to the substrate surface, and a plurality of trenches passing through the base layer to divide the base layer into multiple regions,
the channel regions and the thinning-out regions are provided by the multiple regions of the base layer divided by the trenches, and
each of the trenches is filled with a gate insulation film and a gate electrode, the gate insulation film being disposed on a wall surface of the trench, and the gate electrode being disposed on the gate insulation film.

* * * * *